(12) United States Patent
Hawkins, Sr.

(10) Patent No.: US 6,259,257 B1
(45) Date of Patent: Jul. 10, 2001

(54) NONINTRUSIVE POWER AND CONTINUITY TESTING TOOLS

(76) Inventor: Arnold Hawkins, Sr., 9 Fifth Ave., San Francisco, CA (US) 94118

( * ) Notice: Subject to any disclaimer, the term of this patent is extended or adjusted under 35 U.S.C. 154(b) by 0 days.

(21) Appl. No.: 09/285,137

(22) Filed: Apr. 1, 1999

(51) Int. Cl.$^7$ .................................................. G01R 31/02
(52) U.S. Cl. ........................................ 324/556; 324/133
(58) Field of Search ...................... 324/508, 509, 324/510, 511, 555, 556, 72.5, 133, 149; 340/540, 635, 652, 656

(56) References Cited

U.S. PATENT DOCUMENTS

| | | | |
|---|---|---|---|
| 3,919,631 | * 11/1975 | Brown | 324/133 |
| 4,006,409 | * 2/1977 | Adams | 324/133 |
| 4,205,264 | * 5/1980 | Gold | 324/133 |
| 4,233,560 | * 11/1980 | Blenman | 34/133 |

* cited by examiner

*Primary Examiner*—Safet Metjahic
*Assistant Examiner*—Vincent Q. Nguyen
(74) *Attorney, Agent, or Firm*—Kenneth W. Float

(57) ABSTRACT

Nonintrusive tools for testing power and continuity of AC circuits and wiring. Each tool has a conductive probe extending therefrom that is coupled to a positive terminal of power source or is electromagnetically coupled to a coupling wire that is coupled to the power source. A switching/amplifying device is coupled in series with an indicator between terminals of the power source. A contact is coupled to a switching terminal of the switching/amplifying device that is used to operate the tool when touched by a user. An external coupling device having two electrically isolated wires that are twisted around each other to provide electromagnetic coupling therebetween may be employed when the coupling wire is not used. Physical touching of the contact by the user activates the tool. Once the user activates the tool, the probe may used to directly contact "hot" AC terminals or contact a gel placed on unexposed wires to enhance operation of the tool to determine the presence of power or continuity.

20 Claims, 2 Drawing Sheets

NONINTRUSIVE POWER AND CONTINUITY TESTING TOOLS

BACKGROUND

The present invention relates generally to test equipment, and more particularly, to nonintrusive power and continuity testing tools for use with AC circuits and wiring.

Continuity testing tools are available to test AC lines for continuity. For example, one noncontact tool available at Home Depot, for example, is manufactured by GB Instruments and is marketed under the trade name "Circuit Alert". This tool has an enlarged pencil-like housing and contains an LED and annunciator that, when the tool is turned on, and approaches a "hot" AC contact, such as the "hot" socket of an electrical plug outlet, for example, the LED lights up and the annunciator sounds an alert that is proportional to the distance from the contact or socket. However, the Circuit alert tool cannot be used to detect continuity of a wire within an electrical cord plugged into the electrical plug outlet or in an unplugged appliance or tool, for example.

What is needed is a tool that has the ability to detect continuity of any type of conductor that carries electric current, whether it is exposed or not, and whether it is powered or not. Furthermore, such a tool should be safe that does not jeopardize a user when in the proximity of potentially dangerous electrical circuits. Therefore, it is an objective of the present invention to provide for nonintrusive power and continuity testing tools for use with AC circuits and wiring.

SUMMARY OF THE INVENTION

The present invention provides for nonintrusive power and continuity testing tools that may be used with AC circuits and wiring to detect continuity and the presence of 120 volt AC power, for example. The tools each comprise a housing with a conductive probe extending therefrom. The housing contains a switching/amplifying device, such as a transistor. A contact is exposed at the surface of the housing that is coupled to a switching terminal of the switching/amplifying device that is used to operate the tool.

In a first embodiment, a coupling wire is disposed in the interior of the housing that is wrapped around an internal portion of the probe so that the probe and coupling wire are twisted together to provide electromagnetic coupling therebetween. The probe and the coupling wire are electrically isolated from direct contact with each other. A power source is coupled through the switching/amplifying device and a serially coupled indicator. The coupling wire is coupled to the power source, and consequently, the probe is electromagnetically coupled to the power source via the coupling wire. The probe may be used to directly contact "hot" AC terminals. Physical touching of the contact by a user activates the tool. Because the probe is electromagnetically coupled to circuitry in the housing and is not directly coupled thereto, there is no danger to a user or to the circuitry of the tool.

In a second embodiment, the probe is directly coupled to the power source and the coupling wire is not present within the housing. The balance of the circuitry within the housing is substantially the same as the first embodiment. An external twisted wire pair coupling device is used with the second embodiment of the tool that in essence replaces the internal twisted configuration used in the first embodiment. The external coupling device has two wires that are electrically isolated from each other and are twisted around each other to provide electromagnetic coupling therebetween. One of the wires of the external coupling device is used to contact "hot" AC wires, and the like. The probe of the tool contacts the other of the wires of the external coupling device to implement continuity testing. Because the two conductors of the external coupling device are electromagnetically coupled together and are not directly coupled together, there is no danger to a user or to the circuitry of the tool when the probe contacts the second wire of the external coupling device.

One important aspect of the present invention is that the user is part of the operative circuit when the tool is in use. In particular, the user physically contacts the contact to operate the tool, and thus the user is part of the electrical circuit. While it is not entirely understood, when the user is part of the operational circuit, the tool is entirely functional under substantially all circumstances. However, when the user does not physically contact the switch, the tool does not work. It is believed that this aspect of the present invention is not used in any prior art device of this type.

In addition, under certain circumstances, the use of a conductive gel, paste, or putty may be used to enhance operation of the tool and in certain circumstances may be required for use. For example, it has been found that the use of a dab of a certain toothpaste on the outer surface of an electrical cord readily allows detection of the "hot" wire within the cord. However, when the conductive gel, paste, or putty is not used on the cord, the tool does not work.

BRIEF DESCRIPTION OF THE DRAWINGS

The various features and advantages of the present invention may be more readily understood with reference to the following detailed description taken in conjunction with the accompanying drawing figures, wherein like reference numerals designate like structural elements, and in which.

DETAILED DESCRIPTION

Figure 1:
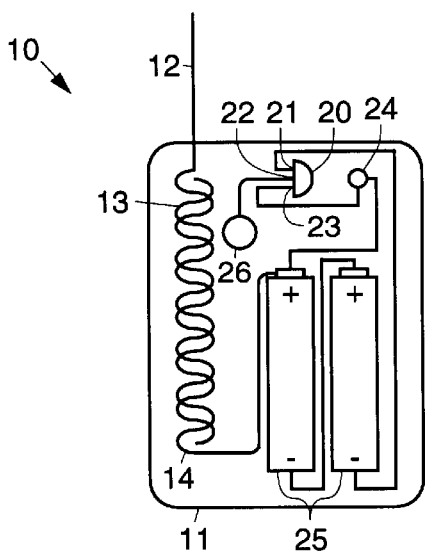
FIG. 1 illustrates a first embodiment of an exemplary nonintrusive power and continuity testing tool in accordance with the principles of the present invention.

Referring to the drawing figures, FIG. 1 illustrates a first embodiment of an exemplary nonintrusive power and continuity testing tool 10 in accordance with the principles of the present invention. The tool 10 may be used with AC circuits and wiring to detect "hot" AC electrical wires and outlets, for example, and to determine if continuity exists in a device, such as a home appliance, for example.

The tool 10 comprises a housing 11 having a conductive probe 12 extending therefrom. The conductive probe 12 may be in the form of a retractable antenna, such as are used in portable radios or cellular telephones, for example.

The housing 11 contains a switching/amplifying device 20, such as a silicon-based transistor 20 having an emitter 21, base 22 and collector 23. A transistor 20 such as a model MPSA 13 NPN epitaxial silicon Darlington transistor 20 may be used as the switching/amplifying device 20. The switching/amplifying device 20 is a three-terminal semiconductor device that provides amplification, switching and detection of the electromagnetic field produced by a "hot" AC terminal or conductor.

A conductive contact 26 that is exposed at the surface of the housing 11 and is coupled to a switching terminal (base 22) of the switching/amplifying device 20. The conductive contact 26 provides a button that is used by a operator of the tool 10 when the tool 10 is checked to see if it is ready for use (i.e., battery test), and the tool 10 is used for continuity testing.

In the first embodiment of the tool 10, the probe 12 is coupled to a coupling wire 14 disposed in the interior of the housing 11 that is wrapped around an internal portion 13 of the probe 12. The end of the internal portion of the probe may be capped or otherwise insulated to prevent inadvertent contact with other components. Thus, the probe 12 and coupling wire 14 are twisted together to provide electromagnetic coupling therebetween. The probe 12 and the coupling wire 14 are electrically isolated from each other. The coupling wire 14 is coupled to a positive terminal of a power source 25, such as a battery 25, which may be provided by two serially coupled 1.5 volt batteries, for example.

The emitter 21 of the transistor 20 is coupled to a negative side of the power source 25. The collector 23 of the transistor 20 is coupled through an indicator 24, such as a light emitting diode (LED) 24, or a sound emitting device, for example, to the positive side of the battery 25. An exemplary a light emitting diode (LED) 24 is a model L53SRC/C LED made by King Bright, for example. The indicator 24 may be an annunciator, such as a buzzer, for example.

The probe 12 may be used to directly contact a "hot" 120 volt AC terminal, for example in order to determine if power is present at the terminal or if power is flowing through a power cord, for example. These will be discussed in more detail with reference to FIGS. 2 and 3. Because the probe 12 is electromagnetically coupled to the circuitry within the housing 11 and not directly coupled thereto, there is no danger to a user or to the circuitry of the tool 10 when testing for AC power.

Figure 2:
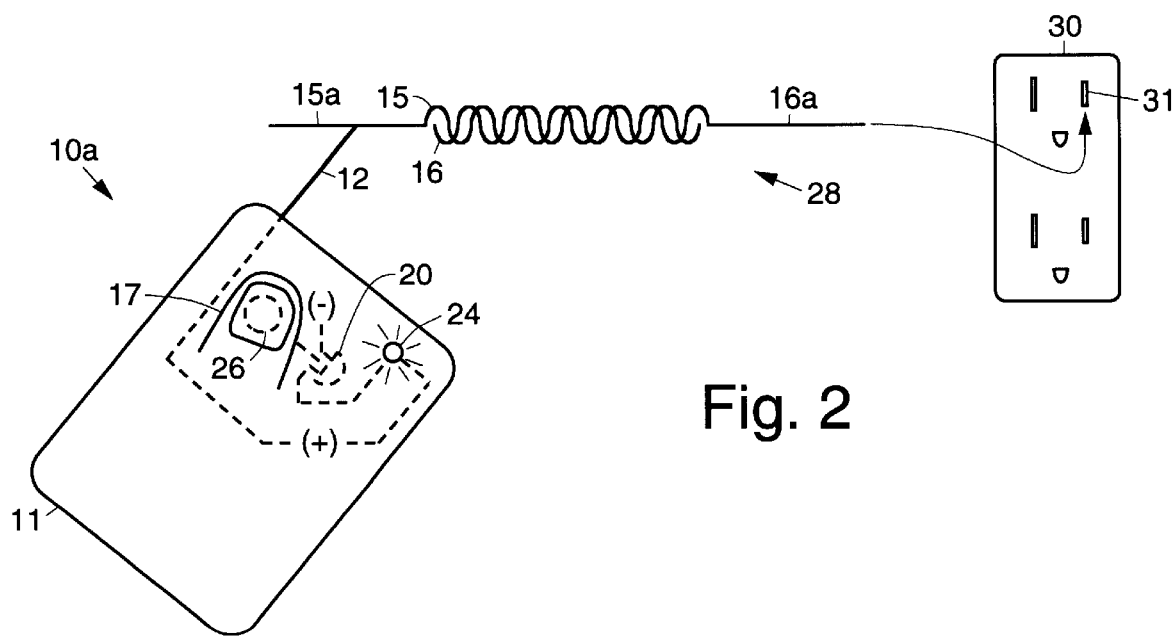
FIG. 2 illustrates a second embodiment of the testing tool used with an external coupling device in accordance with the principles of the present invention.

FIG. 2 illustrates a second embodiment of the present testing tool 10a used with an external twisted wire pair coupling device 28. In the second embodiment of the testing tool 10a, the probe 12, or buzzer is coupled directly to the positive terminal of the power source 25 or battery 25. There is no internal coupling wire 14 in the second embodiment of the testing tool 10a. The balance of the circuitry within the housing 11 is the same as the first embodiment of the tool 10.

The external coupling device 28 is used with the second embodiment of the tool 10a. The external coupling device 28 has two wires 15, 16 that are electrically isolated from each other and are twisted around each other to provide electromagnetic coupling therebetween. Distal ends 15a, 16a of the two respective wires 15, 16 are exposed to provide conductive contacts. One of the distal ends 15a, 16a may be sealed or insulated, if desired. The external coupling device 28 is used to contact "hot" AC wires and "hot" conductors 31 of electrical outlets 30, and the like. Because the two conductors 15, 16 of the external coupling device 28 are electromagnetically coupled together and are not directly coupled together, there is no danger to a user or to the circuitry of the tool 10a.

The coupling device 28 may be made of solid or stranded electrical wires 15, 16 such as 18, 20, 22 or 24 AWG wire, for example. The length of a reduced to practice coupling device 28 is about 14 inches prior to twisting the wires 15, 16 around each other. The wires 15, 16 are twisted around each other to provide about 18–20 wrap-arounds. The distal ends 15a, 16a of the respective wires 15, 16 may be coupled to insulated alligator clips, insulated banana-style multimeter test probes, or a combination of such connectors. The wires 15, 16 of the coupling device 28 are insulated from each other and couple energy electromagnetically, not directly.

An important aspect of the present invention is that the user is part of the operative circuit when the tool 10 is in use. This is illustrated in FIG. 2. The user physically contacts the conductive contact 26 using his or her thumb 17, for example, to operate the tool 10, and thus the user is part of the electrical circuit. While it is not entirely understood, when the user is part of the operational circuit of the tool 10, it is entirely functional under all circumstances. However, when the user does not physically contact the conductive contact 26, the tool 10 does not work.

One possible explanation is that internal doping of different portions of the switching/amplifying device 20 (transistor 20) somehow affects the sensitivity of the transistor 20 to electromagnetic energy flowing through the transistor 20. Energy coupled by way of the probe 12 may somehow interact with electromagnetic energy coupled by the user when the conductive contact 26 is touched, which in turn causes the switching of the transistor 20. In any event, when the user touches the conductive contact 26 and the probe is in the vicinity of or contacts an exposed AC source, for example, the indicator 24 lights up, or buzzes. When the user touches the conductive contact 26 and the probe is remote from the exposed AC source, for example, the indicator 24 does not light up, or buzz. When the user does not touch the conductive contact 26 and the probe is in the vicinity of or contacts an exposed AC source, for example, the indicator 24 does not light up, or buzz. Thus, notwithstanding the fact that the specific interactions that take place in the tools 10, 10a, they operate in the manner described herein.

Figure 3:
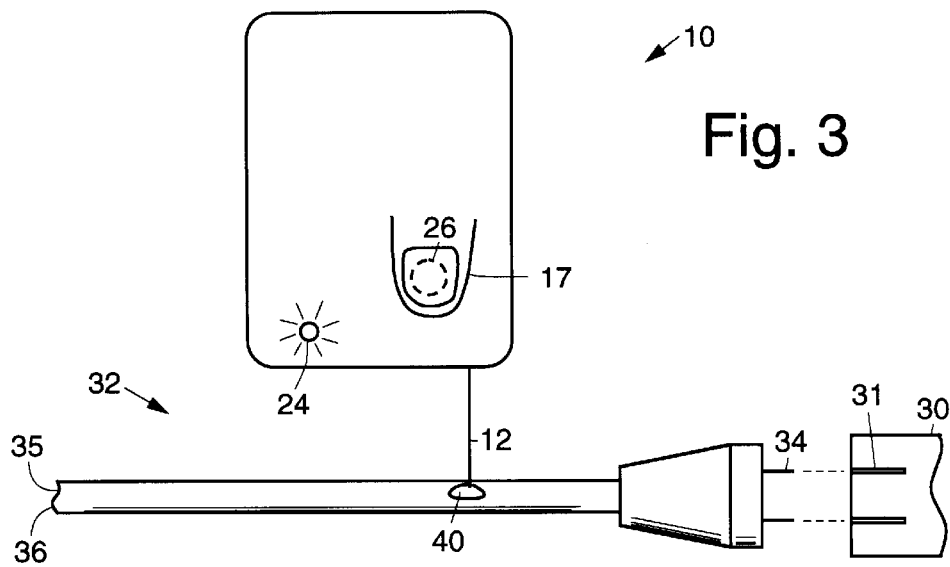
FIG. 3 illustrates the use of the testing tool in conjunction with conductive gel in accordance with the principles of the present invention.

FIG. 3 illustrates the use of the testing tool 10 in conjunction with conductive gel 40, paste 40, or putty 40 in accordance with the principles of the present invention. The conductive gel 40, paste 40, or putty 40 is used to enhance the detecting capability of the tools 10, 10a described with reference to FIGS. 1 and 2, for example. Under certain circumstances, the use of the conductive gel 40, paste 40, or putty 40 may be required to make the tool 10 operative. FIG. 3 shows the conductive gel 40 or putty 40 disposed on the surface of an electrical cord 32, a portion of which is shown. The electrical cord 32 has a plug 34 that is plugged into an electrical outlet 30. The electrical cord 32 has "hot" and ground wires 35, 36 shown extending to the left in FIG. 3.

For example, it has been found that the use of a dab of a certain toothpaste (Crest brand) on the outer surface of an electrical cord 32 readily allows detection of the "hot" wire 35 within the cord 32. A small pea-size dab of gel 40, paste 40, or putty 40 may be used. For additional sensitivity, it has been found that smearing the gel 40, paste 40, or putty 40 over the surface of the cord 32 works well. However, when the conductive gel 40, paste 40, or putty 40 is not used, it has been found that the tool 10 does not work. Apparently, this is because not enough electromagnetic energy couples from the wire 35 to the probe 12 and ultimately to the switching/amplifying device 20 to trigger conduction of the transistor 20 to light the indicator 24, or energize the buzzer.

While other types of gels 40 may be used, it has been found that a liquid material that does not "run" when applied, such as the toothpaste, for example, works best. For example, materials such as Walgreen brand vitamin conditioner, Suebee brand clover honey, and Elizabeth Arden Spa skin care creme have been used which provide the appropriate conductivity to permit operation of the tool 10.

It is also not fully understood why toothpaste works, but it is believed that one of the components in the toothpaste (perhaps water) causes electromagnetic coupling through the exterior surface of the cord 32, thus allowing the electromagnetic field produced by the "hot" wire 35 to be accessible to the probe 12 at the surface of the cord 32. As a consequence, the continuity of the "hot" wire of the cord 32 may be determined.

Figure 4:
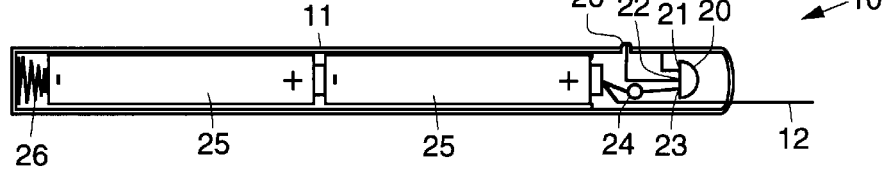
FIG. 4 illustrates an alternative packaging implementation for the tool.

FIG. 4 illustrates an alternative packaging scheme for the tools 10, 10a shown in FIGS. 1 and 2. In the embodiment shown in FIG. 4, the tool 10, 10a is packaged in a cylindrical tube 11 or housing 11 in a manner similar to a penlight-type flashlight. Thus, the probe 12 extends out of the tip of the housing 11 and is internally coupled to the positive terminal of the power source 25. The conductive contact 26 is coupled to the base 22 of the switching/amplifying device 20. The emitter 21 of the switching/amplifying device 20 is connected to the housing 11, which is coupled to the negative terminal of the power source 25. The collector 23 is coupled through the indicator 24, or LED light source 24 or buzzer, to the positive terminal of the power source 25. The power source 25 preferably comprises two 1.5 volt batteries 25 that are forced together using a spring 27 at the bottom end of the housing 11.

In operation, the indicator 24, and in particular the preferable LED light source 24, will light if the tool 10 is functional. This provides an operational status check for the tool 10. Thus, touching the tip or end of the probe 12 with the thumb and/or finger of one hand while touching the conductive contact 26 with the thumb of the other hand will illuminate the LED light source 24, or cause the buzzer to sound.

The tools 10, 10a, in any of their embodiments, senses electromagnetic fields emanating around wires 35, such as those encased in a electrical cord 32. The use of the gel 40, paste 40, or putty 40 in contact with the cord 32 that is to be tested assists in coupling the electromagnetic fields from the wire 35 within the cord 32 to the probe 12 which is made to contact the gel 40 when the switch 26 is operated. The user is in physical contact with the conductive contact 26 when testing for continuity or AC power. The user forms part of an electromagnetic circuit that makes the tools 10, 10a operable.

Figure 5:
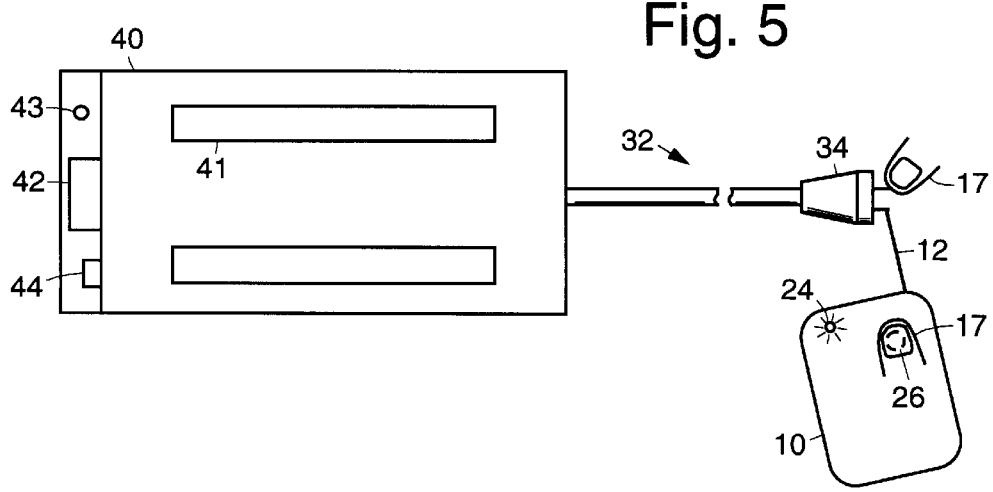
FIG. 5 illustrates the use of the testing tool to perform continuity testing on an exemplary home appliance.

Referring now to FIG. 5, it illustrates the use of the testing tool 10 to perform continuity testing on an exemplary home appliance 40, for example, illustrated as a toaster 40. The toaster 40 has an electrical cord 32 that is coupled by way of electrical circuitry to electrical wires of heating elements 41. The electrical circuitry includes a depressible switch 42, a rotatable heat control switch 44, and an indicator 43, such as a light emitting diode that indicates that the toaster 40 is operating.

It is to be understood that the tools 10, 10a may be used to test continuity on substantially any electrical device including home appliances such as irons, coffee makers, hair dryers, for example, electrical lighting fixtures, for example, and power tools, such as drills and other hand tools, and the like. Consequently, the present invention is not limited to continuity testing of only one type of electrical device. Clearly, there are many such electrical devices that may be tested with the tools 10, 10a.

In order to test continuity of the toaster 40 using the testing tool 10, the toaster 40 is unplugged, the user touches a finger, for example, to one of the electrical prongs of the plug 34, touches the probe 12 of the testing tool 10 to the other electrical prong of the plug 34, and places his or her other thumb on the conductive contact 26. When there is continuity through the circuitry of the toaster 40, the LED 24 on the testing tool 10 lights up. Otherwise, the LED 24 remains unlit, indicating that there is a break in the continuity between the one prong of the plug 34 through the circuitry of the toaster 40 to the other prong of the plug 34.

Thus, nonintrusive power and continuity testing tools have been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A nonintrusive power and continuity testing tool comprising:
    a housing;
    a conductive probe disposed in the housing and having a portion extending from the housing;
    a power source;
    a switching/amplifying device coupled to the power source and that comprises a switching terminal;
    a contact having a portion thereof exposed at the surface of the housing that is directly coupled to the switching terminal of the switching/amplifying device, which contact is used to operate the tool; and
    an indicator coupled between the switching/amplifying device and the power source,
    and wherein the conductive probe is connected to the indicator and the power source.

2. The tool recited in claim 1 wherein the switching/amplifying device comprises a transistor.

3. The tool recited in claim 1 wherein the switching/amplifying device comprises a transistor having an emitter, base and collector, and wherein the base is coupled to the contact, the emitter is coupled to a negative terminal of the power source, and the collector of the transistor is coupled through the indicator to a positive terminal of the power source.

4. The tool recited in claim 1 wherein the power source comprises a battery.

5. The tool recited in claim 1 further comprising a coupling wire disposed in the housing that is wrapped around an internal portion of the probe so that the probe and coupling wire are twisted together to provide electromagnetic coupling therebetween, which coupling wire electromagnetically couples the probe to the power source, and wherein the probe and the coupling wire are electrically isolated from direct contact with each other.

6. The tool recited in claim 1 wherein the probe and the coupling wire are electrically isolated from each other.

7. The tool recited in claim 1 wherein the indicator comprises a light emitting diode.

8. The tool recited in claim 1 wherein the indicator comprises a sound emitting device.

9. The tool recited in claim 8 wherein the conductive gel comprises an electromagnetic energy conducting material.

10. The tool recited in claim 1 further comprising a conductive gel that is disposed on an electrical wire for assisting in coupling electromagnetic energy from the electrical wire to the probe.

11. The tool recited in claim 1 wherein a user contacts the contact and forms part of an electromagnetic circuit through the tool.

12. A nonintrusive power and continuity testing tool comprising:
- a housing;
- a conductive probe disposed in the housing and having a portion extending from the housing;
- a power source;
- a switching/amplifying device coupled to the power source and that comprises a switching terminal;
- a coupling wire that is wrapped around an internal portion of the conductive probe that electromagnetically couples the probe to the power source;
- a contact having a portion thereof exposed at the surface of the housing that is directly coupled to the switching terminal of the switching/amplifying device, which contact is used to operate the tool; and
- an indicator coupled between the switching/amplifying device and the power source and coupled to the probe.

13. The tool recited in claim 12 wherein the switching/amplifying device comprises a transistor.

14. The tool recited in claim 12 wherein the switching/amplifying device comprises a transistor having an emitter, base and collector, and wherein the base is coupled to the contact, the emitter is coupled to a negative terminal of the power source, and the collector of the transistor is coupled through the indicator to a positive terminal of the power source.

15. The tool recited in claim 12 wherein the power source comprises a battery.

16. The tool recited in claim 15 wherein a user contacts the contact and forms part of an electromagnetic circuit through the tool.

17. The tool recited in claim 12 wherein the probe and the coupling wire are electrically isolated from each other.

18. The tool recited in claim 12 wherein the indicator comprises a light emitting diode.

19. The tool recited in claim 12 further comprising a conductive gel that is disposed on an electrical wire for assisting in coupling electromagnetic energy from the electrical wire to the probe.

20. The tool recited in claim 19 wherein the conductive gel comprises an electromagnetic energy conducting material.

* * * * *